(12) United States Patent
Awata

(10) Patent No.: US 7,795,908 B2
(45) Date of Patent: Sep. 14, 2010

(54) ELECTRONIC DEVICE, METHOD FOR CONFIGURING REPROGRAMMABLE LOGIC ELEMENT, COMPUTER-READABLE MEDIUM, COMPUTER DATA SIGNAL AND IMAGE FORMING APPARATUS

(75) Inventor: Yoshinori Awata, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 12/469,415

(22) Filed: May 20, 2009

(65) Prior Publication Data

US 2010/0102849 A1    Apr. 29, 2010

(30) Foreign Application Priority Data

Oct. 27, 2008    (JP) .............................. 2008-275647

(51) Int. Cl.
*H03K 19/173* (2006.01)
(52) U.S. Cl. ...................... 326/38; 326/47; 365/189.08; 716/16; 710/313
(58) Field of Classification Search ............. 326/37–41, 326/47; 710/313–315; 712/12, 16; 716/16; 375/219–220, 295–352; 365/189.08; 711/154
See application file for complete search history.

(56) References Cited

U.S. PATENT DOCUMENTS 6,477,606 B1 * 11/2002 Kawamura et al. .......... 710/305

6,976,118 B1    12/2005 Baier
2006/0119378 A1 * 6/2006 Tonami ......................... 326/8

FOREIGN PATENT DOCUMENTS

JP    2004-21867 A    1/2004
JP    3644590 B2    2/2005

\* cited by examiner

*Primary Examiner*—Rexford N Barnie
*Assistant Examiner*—Jany Tran
(74) *Attorney, Agent, or Firm*—Sughrue Mion, PLLC

(57) ABSTRACT

An electronic device includes a reprogrammable logic element, a configuration data storage, a reading section, a dummy data creating section, a skip determination section, a writing section and a control section. The configuration data storage stores configuration data for the reprogrammable logic element. The reading section successively reads the configuration data from the configuration data storage. The dummy data creating section creates dummy data. The skip determination section determines as to whether or not the configuration data is to be skipped. The writing section writes the configuration data or the dummy data into the reprogrammable logic element. If the skip determination section determines that the configuration data is to be skipped, the control section controls the dummy data, which is created by the dummy data creating section, to be sent to the writing section.

11 Claims, 5 Drawing Sheets

ELECTRONIC DEVICE, METHOD FOR CONFIGURING REPROGRAMMABLE LOGIC ELEMENT, COMPUTER-READABLE MEDIUM, COMPUTER DATA SIGNAL AND IMAGE FORMING APPARATUS

CROSS-REFERENCE TO RELATED APPLICATIONS

This application is based on and claims priority under 35 USC 119 from Japanese Patent Application No. 2008-275647 filed on Oct. 27, 2008.

BACKGROUND

1. Technical Field

The invention relates to an electronic device, a method for configuring a reprogrammable logic element, a computer-readable medium, a computer data signal and an image forming apparatus.

2. Related Art

Electronic devices using reprogrammable logic elements, such as a PGA (Programmable Gate Array), an FPGA (Field Programmable Gate Array), a CPLD (Complex Programmable Logic Device) and a DRP (Dynamically Reconfigurable Processor), have been known. A logic circuit included in such a reprogrammable logic element is rewritable a posteriori by inputting an electric signal thereinto. Hence, such an element has advantages that it is highly universal and that its function can be updated.

SUMMARY

According to an aspect of the invention, an electronic device includes a reprogrammable logic element, a configuration data storage, a reading section, a dummy data creating section, a skip determination section, a writing section and a control section. The configuration data storage stores configuration data for the reprogrammable logic element. The reading section successively reads the configuration data from the configuration data storage. The dummy data creating section creates dummy data. The skip determination section determines as to whether or not the configuration data is to be skipped. The writing section writes the configuration data or the dummy data into the reprogrammable logic element. If the skip determination section determines that the configuration data is to be skipped, the control section controls the dummy data, which is created by the dummy data creating section, to be sent to the writing section.

BRIEF DESCRIPTION OF THE DRAWINGS

Exemplary embodiments of the invention will be described in detail below based on the accompanying drawings, wherein.

DETAILED DESCRIPTION

Figure 1:
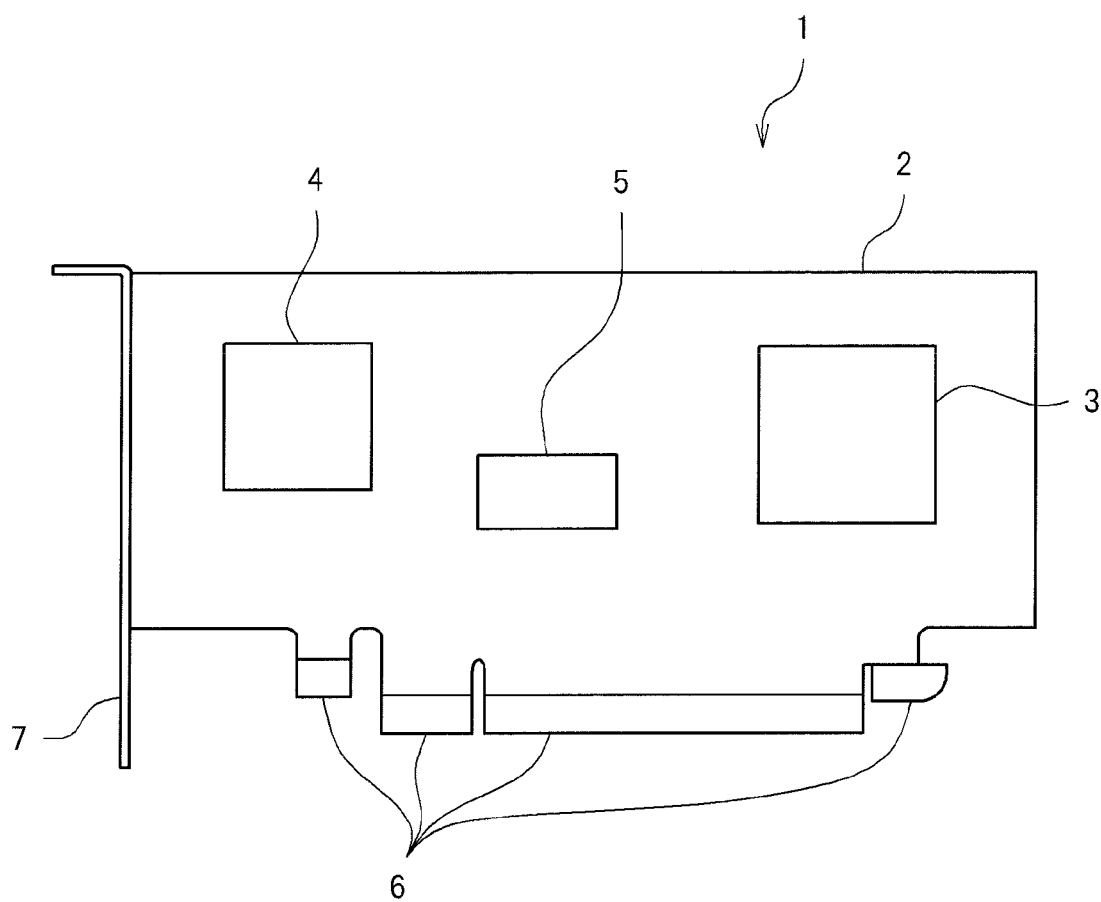
FIG. 1 is a schematic diagram illustrating an electronic device according to an exemplary embodiment 1.

FIG. 1 is a schematic diagram illustrating an electronic device 1 according to an exemplary embodiment 1 of the invention.

The electronic device 1 is a PCI Express card. An FPGA 3 serving as a reprogrammable logic element, a nonvolatile memory 4, a controller 5 and terminals 6 are mounted on a substrate 2 so as to be mutually connected through printed wirings (not shown). A reference numeral 7 denotes a bracket used for loading the electronic device 1 on a computer. Although various other electronic components are additionally mounted on the substrate 2, those components are known and hence are not herein described. In this exemplary embodiment, it is assumed that the electronic device 1 and the reprogrammable logic element are the PCI Express card and the FPGA, respectively. It is noted that the PCI Express card and the FPGA are exemplified for explanation purpose and that the invention is not limited thereto.

The nonvolatile memory 4 serves as a configuration data storage that stores configuration data for the FPGA 3. As the nonvolatile memory 4, any of various PROMs and an EEPROM such as a flash memory may be used. Needless to say, the nonvolatile memory 4 may be a general ROM.

The controller 5 is an electronic circuit used for configuring the FPGA 3 when power is supplied to the electronic device 1. The operation performed therein will be described in detail later.

The terminals 6 are terminals conforming to the PCI Express standards and used for connection with a computer. In this exemplary embodiment, a PCI Express ×16 card is exemplarily illustrated. However, the invention is not limited thereto. A card with an arbitrary lane number such as ×1, ×4 or ×8 may be used. Moreover, the invention is not limited to the PCI Express standards. The terminals 6 may conform to any standards in which configuration should be completed within prescribed time, such as the PCI standards, the Card Bus standards or the Express Card standards.

Figure 2:
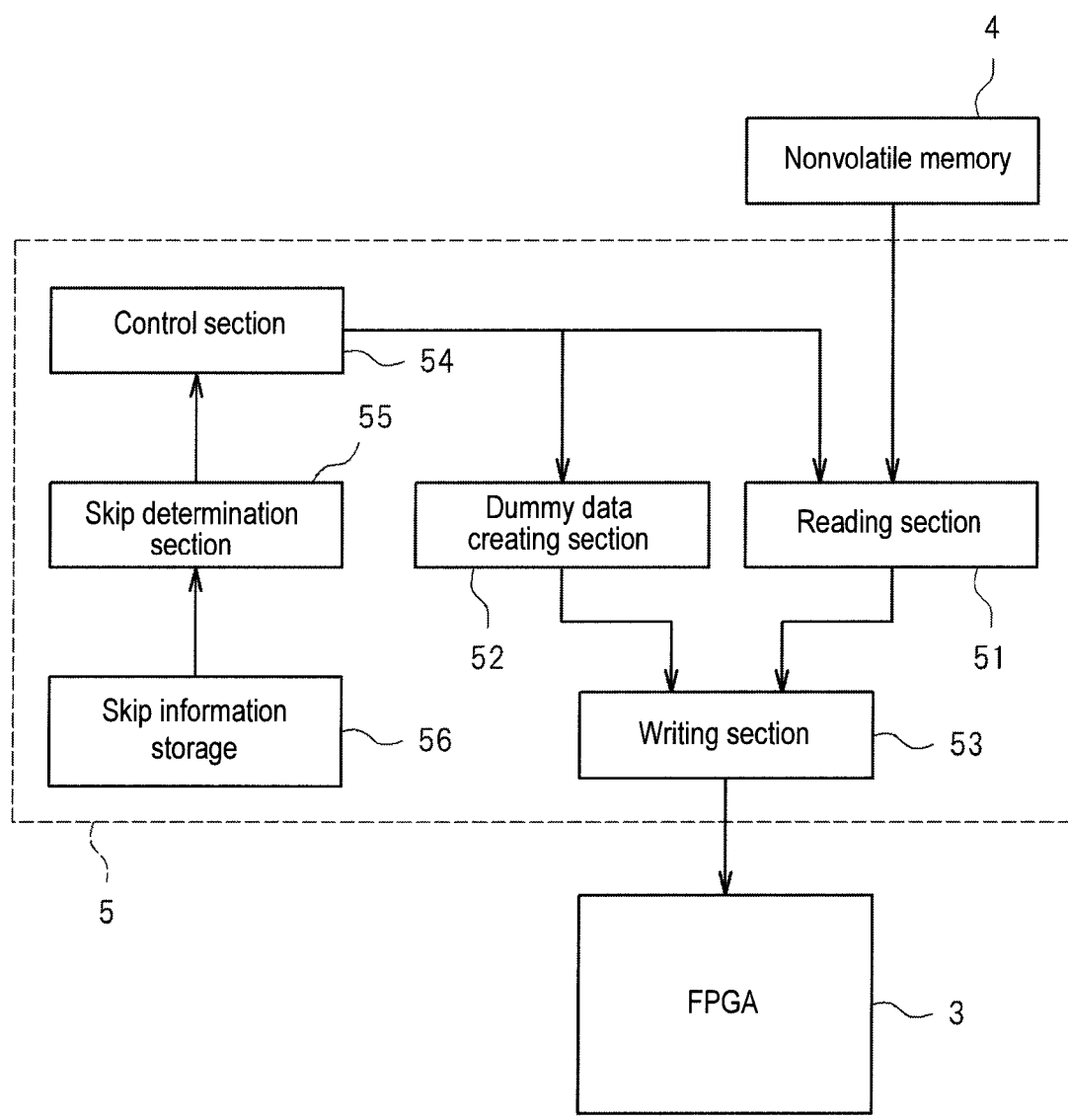
FIG. 2 is a functional block diagram of the electronic device.

FIG. 2 is a functional block diagram of the electronic device 1.

A portion surrounded by broken lines in FIG. 2 corresponds to the controller 5. That portion includes a reading section 51 that successively reads the configuration data from the nonvolatile memory 4, a dummy data creating section 52 that creates dummy data, a writing section 53 that writes the configuration data or the dummy data into the FPGA 3, a control section 54, a skip determination section 55 that determines as to whether or not the configuration data is to be skipped, and a skip information storage 56 that stores a position of configuration data to be skipped. These functional blocks are virtually implemented by a program that operates inside the controller 5 and may not be physically separable from one another. It is noted that the program may be stored in the controller 5 in advance or may be provided with being recorded in an arbitrary information recording medium such as a magnetic recording medium (for example, a magnetic tape or the like) or an optical recording medium (for example, an optical disk or the like), or may be supplied as computer-readable electric signals.

Figure 3:
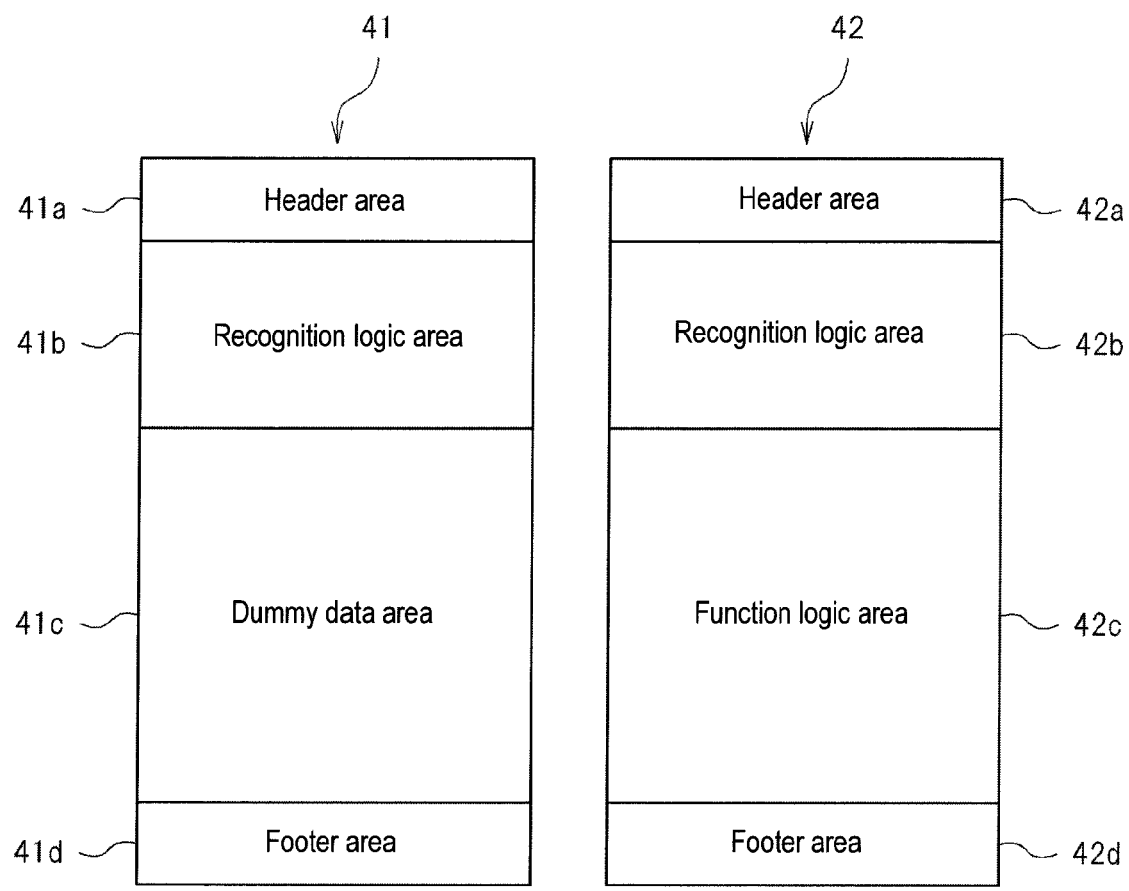
FIG. 3 is a diagram illustrating configuration data stored in a nonvolatile memory.

FIG. 3 is a diagram illustrating the configuration data stored in the nonvolatile memory 4.

In this exemplary embodiment, the nonvolatile memory 4 stores first configuration data 41 and second configuration data 42. The first configuration data 41 includes a header area 41a, a recognition logic area 41b, a dummy data area 41c and a footer area 41d. The second configuration data 42 includes a header area 42*a*, a recognition logic area 42*b*, a function logic area 42*c* and a footer area 42*d*.

Each of the header areas 41*a* and 42*a* is an area containing data required to write the configuration data into the FPGA 3. Each of the recognition logic areas 41*b* and 42*b* is an area containing data used for building a logic required for a device to which the electronic device 1 is connected (for example, the computer in this exemplary embodiment) to recognize the electronic device 1. When the data contained in the recognition logic area 41*b* or 42*b* is written into the FPGA 3, the electronic device 1 gets to respond to a signal supplied from the connected device and is normally recognized by the connected device.

The dummy data area 41*c* is an area containing data used for building a logic so that the FPGA 3 including the logic is not used to perform a specific function. In this exemplary embodiment, one obtained by repeating data for building a logic that makes the FPGA 3 execute nothing, and called, for example, NOP (No Operation) or null design, is used as such data. It goes without saying that data for building any logic may be used as the dummy data. In any case, the logic built by the data contained in the dummy data area 41*c* is not utilized as one exhibiting any function. The data contained in the dummy data area 41*c* may be one obtained by repeated data having a small size such as the NOP or may be data that can be created by some algorithm. A starting position and an ending position of the dummy data area 41*c* in the first configuration data 41 are stored in advance in the skip information storage 56.

The function logic area 42*c* is an area containing data used to build a logic that makes the FPGA 3 exhibit a specific function. When the data contained in the function logic area 42*c* is written into the FPGA 3, the electronic device 1 exhibits the specific function.

Each of the footer areas 41*d* and 42*d* is an area containing data required to end writing of the configuration data into the FPGA 3. Each of the footer areas 41*d* and 42*d* contains data used to check if the data has been normally written into the FPGA 3, such as checksum or a code for CRC (Cyclic Redundancy Check).

In this exemplary embodiment, the data contained in the header areas 41*a* and 42*a* and the data contained in the recognition logic areas 41*b* and 42*b* are commonly used in the first configuration data 41 and the second configuration data 42. The data contained in the footer areas 41*d* and 42*d* are different from each other because the data contained in the dummy data area 41*c* is different from the data contained in the function logic area 42*c*.

Next, an operation of the electronic device 1 that is performed in configuring will now be described with reference to FIGS. 2 and 3.

First, when power is supplied to the electronic device 1, the control section 54 controls the reading section 51 to successively read the first configuration data 41 from the nonvolatile memory 4 and send the read data to the writing section 53. The writing section 53 writes the received data into the FPGA 3. Thereby, the first configuration data 41 is successively written from its head into the FPGA 3.

On the other hand, the skip determination section 55 reads, from the skip information storage 56, a position in which the first configuration data 41 is to be skipped, namely, a position of the dummy data area 41*c* in the first configuration data 41, and determines as to whether or not data that the reading section 51 is about to read is data to be skipped, namely, data contained in the dummy data area 41*c*. Then, the skip determination section 55 informs the control section 54 of the determination result.

During a period in which the skip determination section 55 continues to determine that the first configuration data 41 is not to be skipped, the control section 54 allows the reading section 51 to read. As a result, the data contained in the header area 41*a* and the data contained in the recognition logic area 41*b* are read from the nonvolatile memory 4 and written into the FPGA 3.

On the other hand, if the skip determination section 55 determines that the first configuration data 41 is to be skipped, the control section 54 stops the reading by the reading section 51 and controls the dummy data created by the dummy data creating section 52 to be sent to the writing section 53.

The dummy data creating section 52 repeatedly creates data constituting the NOP as the dummy data. Accordingly, during a period in which the skip determination section 55 continues to determine that the first configuration data 41 is to be skipped, the data constituting the NOP is repeatedly written into the FPGA 3. The data thus written becomes identical with the data contained in the dummy data area 41*c*. Needless to say, if the data contained in the dummy data area 41*c* is not NOP, the dummy data creating section 52 creates data being the same as that contained in the dummy data area 41*c*.

If the skip determination section 55 determines again that the first configuration data 41 is not to be skipped, the control section 54 controls the reading section 51 to read the data from the nonvolatile memory 4, namely, the data contained in the footer area 41*d* and to send the read data to the writing section 53.

When the first configuration data 41 has been written into the FPGA 3 in this manner, the FPGA 3 checks if the data has been normally written. If the check result shows that the data has been normally written, the electronic device 1 is brought into a state where it is recognizable by the connected device.

As understood from the above description, if the skip determination section 55 determines that the first configuration data 41 is to be skipped, the controller 5 writes, into the FPGA 3, the dummy data created by the dummy data creating section 52 of the controller 5. Since the operation of the controller 5 is performed at a higher speed than data is read from the nonvolatile memory 4, the writing of the first configuration data 41 is more rapidly completed as compared with the case where the first configuration data 41 is wholly read from the nonvolatile memory 4 and written.

Furthermore, when the writing of the first configuration data 41 is completed, the control section 54 controls the writing section 53 to write the second configuration data 42 into the FPGA 3. In this case, the whole second configuration data 42 is read from the nonvolatile memory 4 and is written over the first configuration data 41, which has already been written into the FPGA 3. As a result, the data contained in the function logic area 42*c* is written over the data contained in the dummy data area 41*c*, and hence, the electronic device 1 exhibits the specific function.

Although the second configuration data 42 is wholly read from the nonvolatile memory 4 in writing the second configuration data 42 into the FPGA 3 in the above description, the second configuration data 42 may be partially read instead. Specifically, of the second configuration data 42, only the function logic area 42*c* and the footer area 42*d* may be read from the nonvolatile memory 4 and written into the FPGA 3. Alternatively, in the case where the FPGA 3 does not check if data has been normally written, only the function logic area 42*c* may be read and written. Further alternatively, in the case where only a part of the function logic area 42*c* is used for realizing the specific function with the remaining part of the function logic area 42*c* being not in use, for example, being occupied by NOP, for example, only the part of the function logic area 42c may be read and written. In any case, the second configuration data 42 is written over at least a part of the dummy data contained in the first configuration data 41.

Furthermore, the reading section 51 may be provided with a buffer. If the electronic device 1 includes the buffer and if data is read from the nonvolatile memory 4 while writing the dummy data into the FPGA 3, the writing of the first configuration data 41 can be more rapidly completed.

FIG. 2 shows that the skip information storage 56 is provided in the controller. However, the invention is not limited thereto. The skip information storage 56 may be provided outside the controller 5. Alternatively, the nonvolatile memory 4 may work also as the skip information storage 56 by storing the skip information in a part thereof.

An exemplary embodiment 2 of the invention will now be described with reference to FIG. 4.

Figure 4:
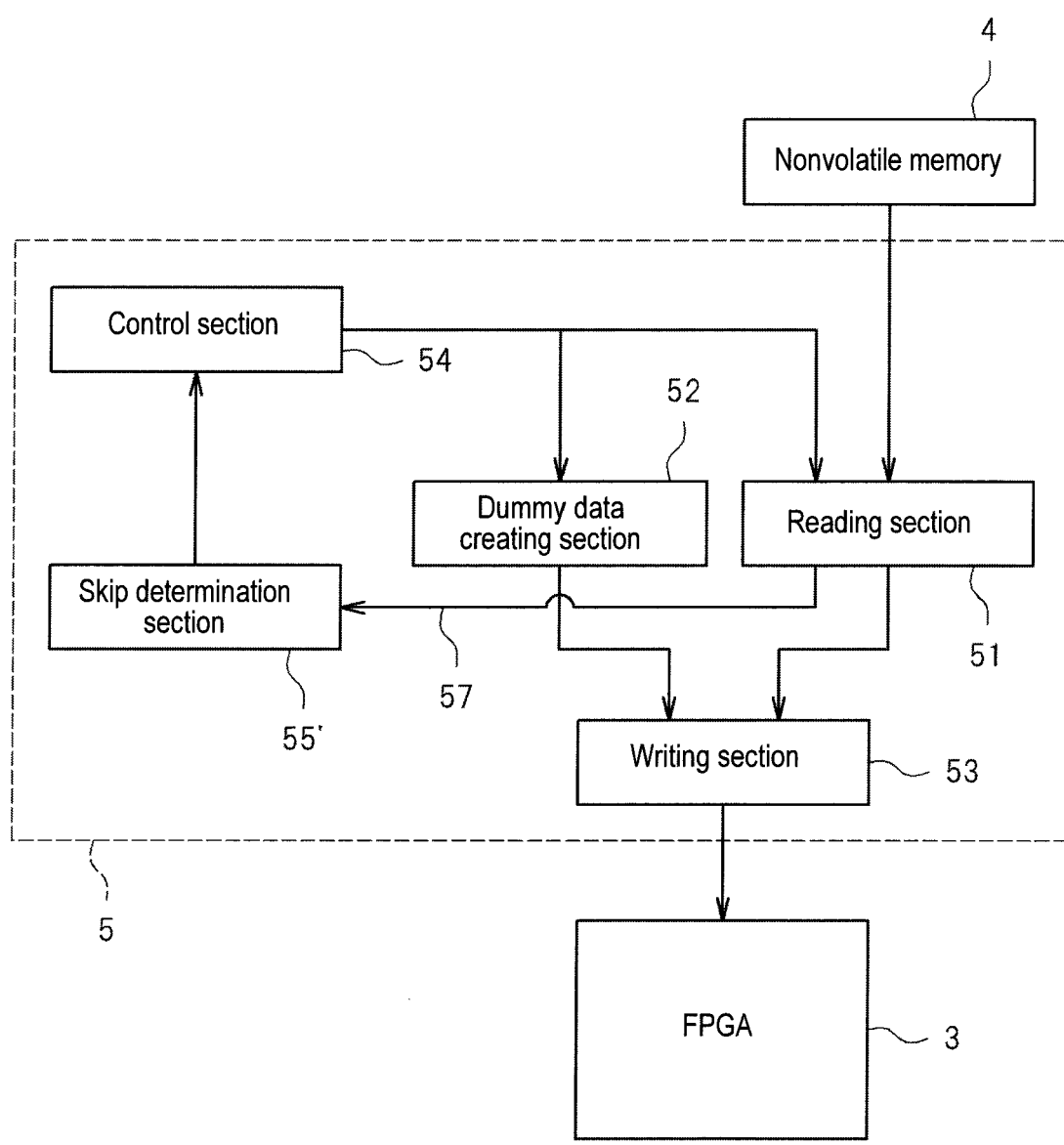
FIG. 4 is a functional block diagram of an electronic device according to an exemplary embodiment 2.

FIG. 4 is a functional block diagram of an electronic device 1 according to the exemplary embodiment 2 of the invention. This exemplary embodiment is different from the exemplary embodiment 1 in a skip determination section 55' that determines as to whether or not first configuration data 41 is to be skipped, based on data read by a reading section 51 without using the skip information storage. The remaining portions of the exemplary embodiment 2 are the same as those of the exemplary embodiment 1. Hence, similar reference numerals are used to refer to elements that are similar to those of the exemplary embodiment 1, and the description on those elements will be omitted.

In this exemplary embodiment, as illustrated with a reference numeral 57, the first configuration data 41 successively read by the reading section 51 is also sent to the skip determination section 55'. The skip determination section 55' determines as to whether or not the first configuration data 41 is to be skipped, based on the data read by the reading section 51, namely, by detecting specific data such as NOP. Specifically, the skip determination section 55' determines that the first configuration data 41 is not to be skipped until NOP is read, and determines that the first configuration data 41 is to be skipped once NOP is detected. An ending position of a data range to be skipped is detected when a position of data to be written into an FPGA 3 reaches a position in which a footer area 41d is to be written.

The data detected by the skip determination section 55' is not limited to NOP but may be another specific data.

An exemplary embodiment 3 of the invention will now be described with reference to FIG. 5.

Figure 5:
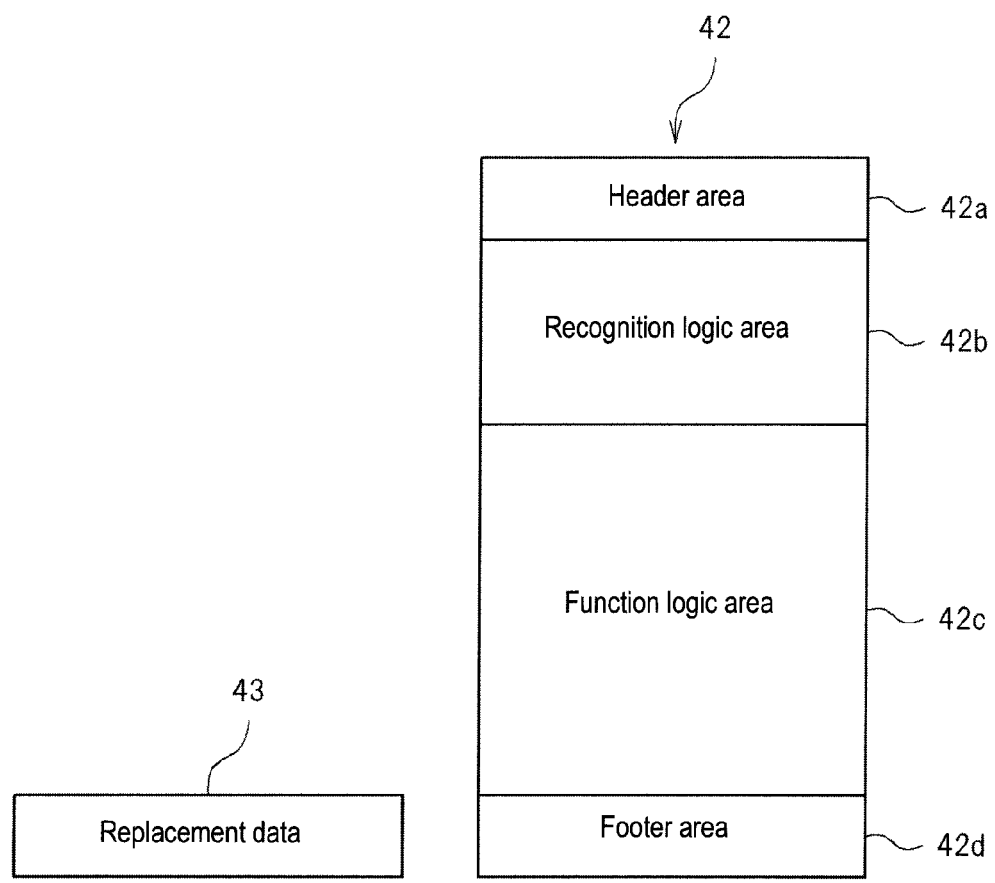
FIG. 5 is a diagram illustrating configuration data stored in a nonvolatile memory of an electronic device according to an exemplary embodiment 3.

FIG. 5 is a diagram illustrating configuration data stored in a nonvolatile memory 4 of an electronic device 1 according to the exemplary embodiment 3. This exemplary embodiment is different from the exemplary embodiment 1 in that the nonvolatile memory 4 does not store first configuration data 41 but stores second configuration data 42 alone. The remaining portions of the exemplary embodiment 3 are the same as those of the exemplary embodiment 1. Hence, similar reference numerals are used to refer to elements that are similar to those of the exemplary embodiment 1, and description on those elements will be omitted.

In FIG. 5, data designated by a reference numeral 43 is data that should be a footer area of first configuration data if the first configuration data were to be present. It is herein referred to as replacement data 43 for the sake of convenience. The second configuration data 42 of this exemplary embodiment is the same as that of the exemplary embodiment 1.

An operation of the electronic device 1 of this exemplary embodiment that is performed in configuring is as follows:

Referring to FIG. 2 again, when power is supplied to the electronic device 1 at first, a control section 54 controls a reading section 51 to successively read the second configuration data 42 from a nonvolatile memory 4 and to send the read data to a writing section 53. The writing section 53 writes the received data into an FPGA 3. Thus, the second configuration data 42 is successively written into the FPGA 3 from its head.

Meanwhile, a skip determination section 55 reads, from a skip information storage 56, a position in which the second configuration data 42 is to be skipped, namely, a position that would correspond to a dummy data area of the first configuration data if the first configuration data were to be present. Then, the skip determination section 55 determines as to whether or not data that the reading section 51 is about to read is data to be skipped, and informs the control section 54 of the determination result.

During a period in which the skip determination section 55 continues to determine that the second configuration data 42 is not to be skipped, the control section 54 allows the reading section 51 to read the data. As a result, data contained in a header area 42a and data contained in a recognition logic area 42b are read from the nonvolatile memory 4 and written into the FPGA 3.

On the other hand, when the skip determination section 55 determines that the second configuration data 42 is to be skipped, the control section 54 stops the reading by the reading section 51 and controls the reading section 51 to send dummy data created by a dummy data creating section 52 to the writing section 53.

Specifically, the dummy data creating section 52 repeatedly creates the dummy data in a position corresponding to a function logic area 42c of the second configuration data 42 and sends the created data. As a result, data that would constitute dummy data contained in a dummy data area of the first configuration data if the first configuration data were to be present is written into the FPGA 3.

When the skip determination section 55 determines again that the second configuration data 42 is not to be skipped, the control section 54 controls the reading section 51 to read the replacement data 43 and send it to the writing section 53.

In this manner, the data same as the first configuration data 41 of the exemplary embodiment 1 is written into the FPGA 3. The electronic device 1 is brought into a state where the electronic device 1 is recognizable by a device connected to the electronic device 1. Furthermore, the writing of the data same as the first configuration data 41 is rapidly completed as in the exemplary embodiment 1.

Furthermore, when the writing of the data same as the first configuration data 41 is completed, the control section 54 controls the writing section 53 to write the second configuration data 42 into the FPGA 3 in the same manner as in the exemplary embodiment 1. As a result, the electronic device 1 exhibits a specific function.

As is understood from the above description, in this exemplary embodiment, an amount of configuration data stored in the nonvolatile memory 4 is small as compared with the exemplary embodiment 1.

In this exemplary embodiment, since the replacement data 43 is different from the data contained in the footer area 42d of the second configuration data 42, the replacement data 43 is prepared separately from the second configuration data 42. However, in the case where the FPGA 3 does not check if data has been normally written, the replacement data 43 may be identical with the data contained in the footer area 42d of the second configuration data 42. Therefore, the data contained in the footer area 42d may be used as the replacement data 43 without the replacement data 43 being prepared separately.

In an exemplary embodiment 4 of this invention mentioned, an image forming apparatus including the electronic device 1 of any of the exemplary embodiments 1 to 3. Herein, a logic circuit for realizing at least a part of functions of the image forming apparatus is written by configuration into the FPGA 3 included in the electronic device 1. The functions of the image forming apparatus realized by using the electronic device 1 are, for example, a function to control the operation of the image forming apparatus itself, a function as a communication interface, and the like.

In this exemplary embodiment, the electronic device 1 is not always a PCI Express card. Also, the reprogrammable logic element provided in the electronic device 1 is not limited to the FPGA 3.

Furthermore, the image forming apparatus may be a printer, a copying machine or a multifunction machine. A multifunction machine may be an apparatus having at least two or more functions out of a function of serving as a copying machine, a function of serving as a scanner and a function of serving as a facsimile.

What is claimed is:

1. An electronic device comprising:
    a reprogrammable logic element;
    a configuration data storage that stores configuration data for the reprogrammable logic element;
    a reading section that successively reads the configuration data from the configuration data storage;
    a dummy data creating section that creates dummy data;
    a skip determination section that determines as to whether or not the configuration data is to be skipped;
    a writing section that writes the configuration data or the dummy data into the reprogrammable logic element; and
    a control section, wherein if the skip determination section determines that the configuration data is to be skipped, the control section controls the dummy data, which is created by the dummy data creating section, to be sent to the writing section.

2. The electronic device according to claim 1, wherein
    if the skip determination section determines that the configuration data is not to be skipped, the control section controls the configuration data read by the reading section to be sent to the writing section.

3. The electronic device according to claim 2, wherein
    the control section performs control so that after first configuration data including the dummy data is written into the reprogrammable logic element, second configuration data different from the first configuration data is written into the reprogrammable logic element.

4. The electronic device according to claim 3, wherein
    the configuration data storage stores the second configuration data and does not store the first configuration data.

5. The electronic device according to claim 4, wherein
    the configuration data storage stores data used for checking as to whether or not the first configuration data has been normally written in the reprogrammable logic element.

6. The electronic device according to claim 3, wherein
    the control section partially performs the writing of the second configuration data so as to overwrite at least a part of the dummy data contained in the first configuration data.

7. The electronic device according to claim 1, further comprising:
    a skip information storage that stores skip information indicating a position where the configuration data is skipped, wherein
    the skip determination section determines as to whether or not the configuration data is to be skipped, based on the skip information stored in the skip information storage.

8. The electronic device according to claim 1, wherein
    the skip determination section determines as to whether or not the configuration data is to be skipped, based on the configuration data read by the reading section.

9. An image forming apparatus comprising:
    the electronic device according to claim 1.

10. A method for configuring a reprogrammable logic element, the method comprising:
    successively reading configuration data for the reprogrammable logic element;
    determining as to whether or not the configuration data is to be skipped;
    if it is determined that the configuration data is to be skipped, creating dummy data and writing the created dummy data into the reprogrammable logic element; and
    if it is determined that the configuration data is not to be skipped, writing the read configuration data into the reprogrammable logic element.

11. A computer-readable medium storing a program that causing an electronic circuit to function as a controller, the controller including:
    a configuration data storage that stores configuration data;
    a reading section that successively reads the configuration data from the configuration data storage;
    a dummy data creating section that creates dummy data;
    a skip determination section that determines as to whether or not the configuration data is to be skipped;
    a writing section that writes the configuration data or the dummy data into a reprogrammable logic element; and
    a control section, wherein if the skip determination section determines that the configuration data is to be skipped, the control section controls the dummy data, which is created by the dummy data creating section, to be sent to the writing section.

* * * * *